(12) United States Patent
Haga et al.

(10) Patent No.: US 7,190,179 B2
(45) Date of Patent: Mar. 13, 2007

(54) CONTACT PROBE

(75) Inventors: Tsuyoshi Haga, Osaka (JP); Kazunori Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 226 days.

(21) Appl. No.: 10/472,571

(22) PCT Filed: Apr. 10, 2002

(86) PCT No.: PCT/JP02/03585

§ 371 (c)(1),
(2), (4) Date: Sep. 24, 2003

(87) PCT Pub. No.: WO02/084306

PCT Pub. Date: Oct. 24, 2002

(65) Prior Publication Data

US 2004/0104739 A1 Jun. 3, 2004

(30) Foreign Application Priority Data

Apr. 13, 2001 (JP) ............... 2001-115312
Dec. 6, 2001 (JP) ............... 2001-372542

(51) Int. Cl.
*G01R 31/02* (2006.01)

(52) U.S. Cl. .................................... 324/754

(58) Field of Classification Search ............... None
See application file for complete search history.

(56) References Cited

U.S. PATENT DOCUMENTS 4,773,877 A    9/1988  Krueger
4,774,462 A *  9/1988  Black ................... 324/758
5,015,947 A    5/1991  Chism
5,513,430 A    5/1996  Yanof et al.
5,576,630 A   11/1996  Fujita
5,667,410 A    9/1997  Johnston
5,977,783 A   11/1999  Takayama et al.
5,989,994 A   11/1999  Khoury et al.

(Continued)

FOREIGN PATENT DOCUMENTS

CH          676885          3/1991

(Continued)

OTHER PUBLICATIONS

U.S. Appl. No. 09/604,463; pp. 1 to 44, 6 sheets of drawings.

(Continued)

*Primary Examiner*—Ha Tran Nguyen
*Assistant Examiner*—Trung Q. Nguyen
(74) *Attorney, Agent, or Firm*—W. F. Fasse; W. G. Fasse

(57) ABSTRACT

A contact probe is fabricated by forming a resin mold with a cavity on a substrate having conductivity, and filling the cavity with metal through electroforming. The metal includes a cobalt-tungsten alloy. Alternatively, a cobalt-molybdenum alloy may be used instead of the cobalt-tungsten alloy. Alternatively, a contact probe can be made from nickel, cobalt or copper, and have a coat film of cobalt-tungsten alloy or cobalt-molybdenum alloy formed thereon to increase the abrasion resistance. A nickel-molybdenum alloy can be used instead of the cobalt-tungsten alloy or cobalt-molybdenum alloy.

11 Claims, 8 Drawing Sheets

U.S. PATENT DOCUMENTS

| | | |
|---|---|---|
| 6,358,097 B1 | 3/2002 | Peters |
| 6,835,898 B2 * | 12/2004 | Eldridge et al. ............ 174/267 |
| 2002/0127812 A1 | 9/2002 | Matsunaga et al. |

FOREIGN PATENT DOCUMENTS

| | | |
|---|---|---|
| DE | G8711110 | 2/1988 |
| EP | 1160576 | 12/2001 |
| EP | 1 365 250 | 11/2003 |
| JP | 6-22964 | 3/1994 |
| JP | 6-22965 | 3/1994 |
| JP | 07-027789 | 1/1995 |
| JP | 09-034286 | 2/1997 |
| JP | 09-119945 | 5/1997 |
| JP | 09-279365 | 10/1997 |
| JP | 10303258 | 11/1998 |
| JP | 11-044708 | 2/1999 |
| JP | 11-064381 | 3/1999 |
| JP | 11-160355 | 6/1999 |
| JP | 11-191453 | 7/1999 |
| JP | 11-269587 | 10/1999 |
| JP | 11-326376 | 11/1999 |
| JP | 11-337575 | 12/1999 |
| JP | 2000-162241 | 6/2000 |
| JP | 2001-13166 | 1/2001 |
| JP | 2001-342591 | 12/2001 |

OTHER PUBLICATIONS

T. Haga et al.: "Development of micro contact probe" Sei Tekunikaru Rebyuu, No. 161, Sep. 2002, pp. 87-90, XP009052004, Amsterdam Holland (with English Abstract).

Y. Hirata; "LIGA process—micromachining technique using synchrotron radiation lithography—and some industrial applications" Nuclear Instruments and Methods in Physics Research, Section -B 208: Beam Interactions with Materials and Atoms, Aug. 2003, pp. 21-26, XP004438693, Japan (in English).

* cited by examiner

CONTACT PROBE

TECHNICAL FIELD

The present invention relates to a contact probe to perform electrical testing on a semiconductor IC chip, a liquid crystal display device, and the like.

BACKGROUND ART

Electrical testing on a circuit formed on a semiconductor substrate, a liquid crystal device, and the like is conducted using a tester formed of a probe card having a plurality of contact probes disposed corresponding to the arrangement of the circuit to be tested.

A contact probe requires a leading end with contact capability and a spring with urging capability to ensure the contact with the pattern interconnection that is the subject of testing without damaging the interconnection and that allows repetitive usage.

These elements are conventionally configured with a combination of individual components thereof. Fabrication of a contact probe formed integrally by electroforming is disclosed in, for example, Japanese Patent Laying-Open Nos. 2000-162241 and 11-337575. Such contact probes allow the usage of copper, nickel, aluminum, rhodium, palladium, tungsten, a nickel-cobalt alloy, and the like as the electroforming material.

Japanese Patent Laying-Open No. 9-34286 discloses the technique of forming a fixation belt using, as the substrate, an endless electroforming sheet made from a nickel-manganese alloy containing 0.05–0.6 wt % manganese and having a Micro-Vickers hardness of 450–650 to provide a fixation belt for a photolithography apparatus having high thermal conductivity and rigidity as well as superior heat resistance and fatigue resistance.

Japanese Patent Laying-Open No. 11-44708 discloses a contact probe having a plurality of pattern interconnections formed on a film with the tip protruding therefrom, using a nickel-manganese alloy as the material. This contact probe is composed of a first metal layer formed of a nickel-manganese alloy containing at least 0.05% by weight manganese, and a second metal layer having toughness and conductivity higher than those of the first metal layer. The contact probe has the second metal layer bent outwards partially. The publication teaches that such a contact probe has high hardness and high mechanical strength to allow repetitive usage.

For a contact probe, hardness, elasticity, and abrasion resistance are required as a contact that can be repeatedly used by being urged against a circuit to be tested. The contact probe must also be heat resistant to exhibit sufficient performance even when used under high temperature for application to burn-in testing. In accordance with the techniques disclosed in the aforementioned two publications, selection of the component of the alloy to improve the hardness and heat resistance, coverage by means of different types of material, and microscopic configurations have been employed. However, the hardness of the electroforming material was only 600–700 at most in Micro-Vickers hardness. The abrasion resistance was still not sufficient in view of repetitive scribing that will be conducted as a contact probe.

Thus, there is a limit in improving the hardness of a contact probe formed in one piece by means of electroforming since the hardness of the material of the substrate itself is limited. The need arises for a contact probe that can exhibit sufficient performance in all the aspects of hardness, elasticity, abrasion resistance, and heat resistance.

DISCLOSURE OF THE INVENTION

An object of the present invention is to provide a contact probe superior in all the aspects of hardness, elasticity, abrasion resistance, and heat resistance.

To achieve the above object, a contact probe according to an aspect of the present invention is fabricated by forming a resin mold on a substrate having conductivity, and filling the cavity of the resin mold with metal through electroforming. The metal is a nickel-manganese alloy. The average crystal grain size of nickel is not more than 70 nm. The contact probe is formed of a material in which the preferred orientation of the nickel crystal by X-ray diffraction is (111) towards the electroforming deposition direction. Such a contact probe has the required hardness and elasticity even when used under high temperature.

According to another aspect of the present invention, a contact probe is fabricated by forming a resin mold with a cavity on a substrate having conductivity, and filling the cavity with metal through electroforming. The metal includes a cobalt-tungsten alloy. By employing such a configuration, the abrasion resistance and heat resistance can be improved. The same applies by using a cobalt-molybdenum alloy or nickel-molybdenum alloy instead of the cobalt-tungsten alloy. Also, a contact probe coated with any of said three types of alloys on the surface can be used even if the interior is formed of another metal.

BEST MODES FOR CARRYING OUT THE INVENTION (First Embodiment)

Figure 1:
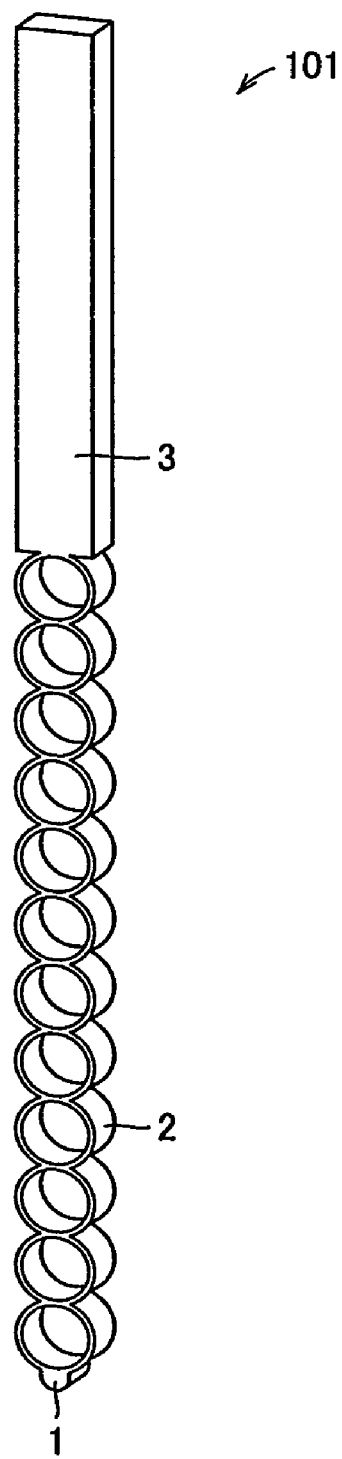
FIG. 1 is a perspective view of a contact probe according to a first embodiment of the present invention.

A contact probe 101 according to a first embodiment of the present invention includes, as shown in FIG. 1 by way of example, a plunger unit 1 to establish contact with a circuit to be tested, a spring unit 2 supporting plunger unit 1 at one end, and a lead line connection unit 3 electrically connecting the other end of spring unit 2 with a lead line. Plunger unit 1, spring unit 2 and lead line connection unit 3 are formed in one piece.

Figure 2:
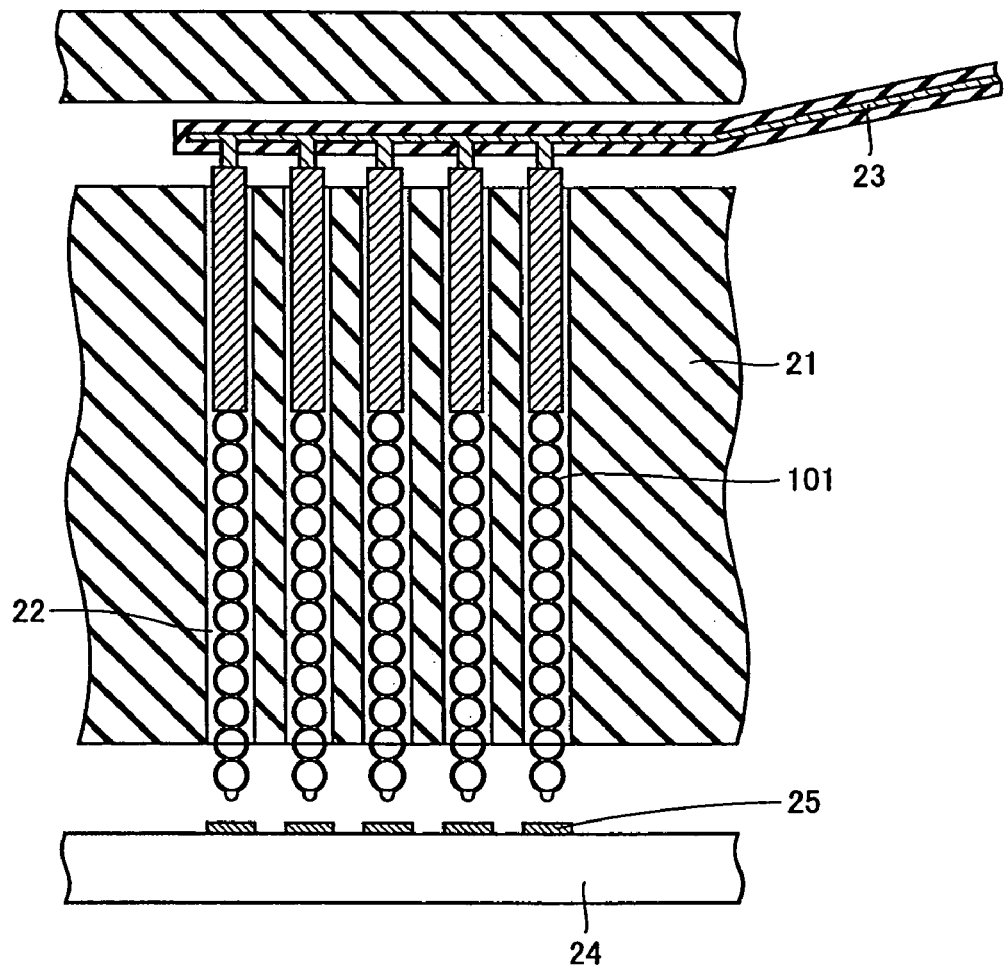
FIG. 2 is a diagram to describe the contact probe according to the first embodiment of the present invention in a usage status.

A probe card to which a contact probe is attached is configured as shown in FIG. 2. A plurality of guide holes 22 are formed in an insulation substrate 21 in accordance with the arrangement pitch of an under-test circuit 25. A contact probe 101 is disposed in each guide hole 22. The leading end of each contact probe 101 protrudes from the plane of insulation substrate 21 facing an under-test substrate 24. At the other plane of insulation substrate 21 opposite to under-test substrate 24, a flexible printed circuit (FPC) 23 or the like identified as a lead line is disposed to be electrically connected to lead line connection unit 3 of each contact probe 101. Under-test circuit 25 is to be tested using such a tester.

With regards to the performance required in such contact probes for usage in a probe card, the inventors of the present invention identified the values set forth below. In order to generate sufficient load with a small spring mechanism, the Young's modulus is preferably at least 180 GPa, and the elastic limit is preferably at least 1150 MPa, further preferably at least 1300 MPa. In order to exhibit abrasion resistance, the hardness is preferably at least 5000 N/mm$^2$, further preferably at least 5800 N/mm$^2$. As to heat resistance, it is required that these values are met under the usage of a high temperature up to approximately 150° C.

The metal used as the material of the contact probe of the present invention is a nickel-manganese alloy. Although nickel (Ni) alone or a nickel type alloy such as Ni—Co or Ni—W can be thought of as the material of the contact probe, metal not containing manganese is disadvantageous in that sulfur brittleness is induced at high temperature to become fragile, and heat resistance will be degraded. Such tendency of degradation in heat resistance is significant in the range of a high temperature of 200° C. and above. Although palladium (Pd), rhodium (Rh) or ruthenium (Ru) may be added to the metal identified as the material of the contact probe, there will be the drawback of the material cost being increased.

The amount of manganese contained in the nickel-manganese alloy is preferably at least 0.01% by weight and less than 0.3% by weight, further preferably at least 0.01% by weight and less than 0.15% by weight. If the amount of manganese is less than 0.01% by weight, the effect of adding manganese is small, i.e., heat resistance is low. If the amount of manganese is 0.3% by weight or above, the elastic limit cannot be maintained at a high level although heat resistance is achieved.

The nickel-manganese alloy can contain carbon from the standpoint of increasing hardness. The amount of carbon contained in the nickel-manganese alloy is preferably not more than 0.02% by weight, more preferably at least 0.001% by weight and not more than 0.02% by weight, and particularly preferably at least 0.001% by weight and not more than 0.01% by weight. If the amount of carbon exceeds 0.02% by weight, the elastic limit is degraded.

The average crystal grain size of nickel in the nickel-manganese alloy must be not more than 70 nm, preferably not more than 50 nm. If the average crystal grain size of nickel exceeds 70 nm, both the elastic limit and hardness are degraded.

The preferred orientation of the nickel crystal in the nickel-manganese alloy by X-ray diffraction is (111) towards the deposition direction liquid (surface direction) of the nickel-manganese alloy layer in electroforming. If the preferred orientation is not (111), the Young's modulus and elastic limit are so low that, when fabricated into a contact probe, it will be difficult to generate sufficient load.

Fabrication Method of Contact Probe

A fabrication method of a contact probe includes the step of forming a mold for electroforming, the step of forming a metal layer onto the mold for electroforming, and the step of removing the mold for electroforming.

The electroforming mold formation step can be conducted by a lithography step, or a step using a framework such as a die.

Figure 3:
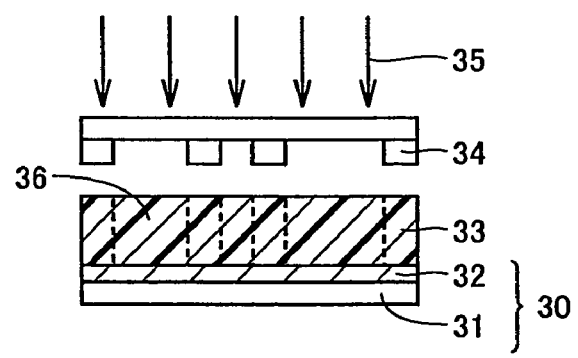
FIG. 3 is a sectional view of the contact probe according to the first embodiment of the present invention corresponding to a fabrication method of a resist formation step and an exposure step.

The step by lithography includes a resist formation step, an exposure step, and a resist removal step. In the resist formation step, a resist film is formed on the surface of a substrate having conductivity. As a substrate, a conductive substrate such as of SUS, Cu, Al and the like, or a substrate 30 as shown in FIG. 3, having the metal of Ti, Al, Cu or a combination thereof formed as a conductor layer 32 by sputtering on a substrate 31 made from Si, glass, or the like can be used. In the exposure step, an X-ray 35 is directed to resist film 33 using a mask 34 corresponding to the configuration of the desired contact probe, as shown in FIG. 3.

Figure 4:
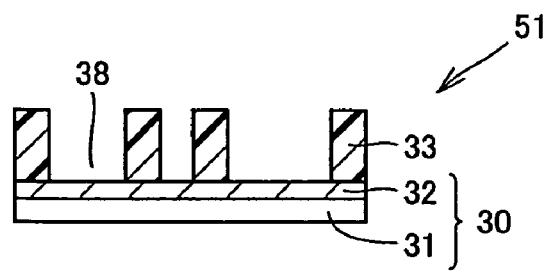
FIG. 4 is a sectional view of the contact probe according to the first embodiment of the present invention corresponding to a fabrication method of a resist removal step.

UV light may be used instead of X-ray 35 in some cases. In the resist removal step, resist 33 of an exposure region 36 is removed by development. As a result, a mold 51 for electroforming is formed as shown in FIG. 4.

Figure 9:
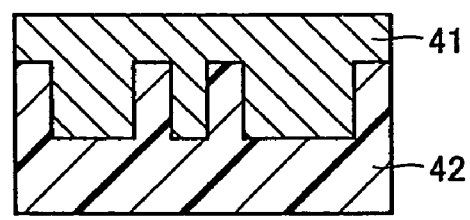
FIG. 9 is a sectional view of the contact probe according to the first embodiment of the present invention corresponding to a fabrication method of a formation step of a resin body.
Figure 10:
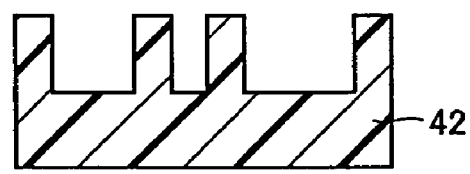
FIG. 10 is a sectional view of the contact probe according to the first embodiment of the present invention corresponding to a fabrication method of a resin body.
Figure 11:
FIG. 11 is a sectional view of the contact probe according to the first embodiment of the present invention corresponding to a fabrication method after the resin body is ground.
Figure 12:
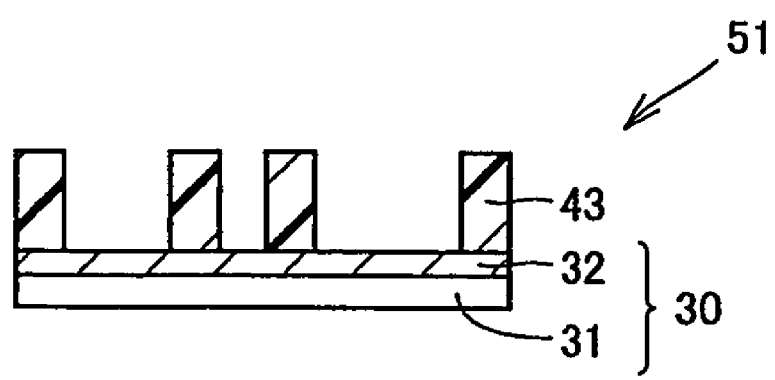
FIG. 12 is a sectional view of the contact probe according to the first embodiment of the present invention corresponding to a fabrication method in the state where the resin body after being ground is attached to the substrate.

In the step of forming a mold for electroforming using a die, molding such as injection molding is conducted using a die 41 having a convex portion as shown in FIG. 9 to form a resin mold 42 with a recess as shown in FIG. 10. Then, grinding is conducted to result in a resin pattern frame 43 with throughholes corresponding to the recess regions, as shown in FIG. 11. Resin pattern frame 43 is attached on substrate 30 having conductivity, as shown in FIG. 12. For a substrate 30 having conductivity, a substrate similar to that when a resin mold is to be fabricated by lithography can be used. A conductive substrate such as of SUS, Cu, Al and the like, or a substrate 30 having the metal of Ti, Al, Cu or a combination thereof formed as a conductor layer 32 by sputtering on a substrate 31 made from Si, glass, or the like can be used.

Figure 5:
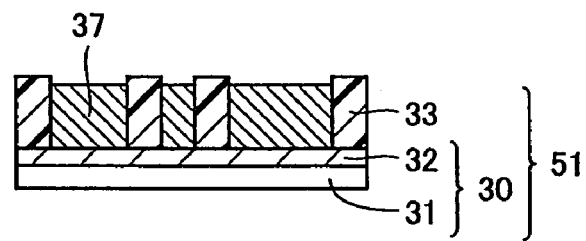
FIG. 5 is a sectional view of the contact probe according to the first embodiment of the present invention corresponding to a fabrication method of a step of forming a metal layer on a resin mold.
Figure 6:
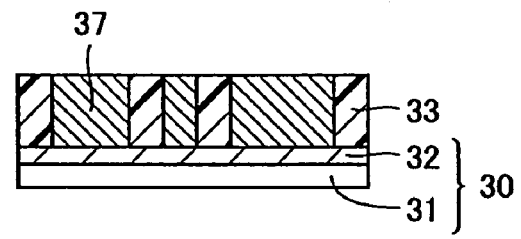
FIG. 6 is a sectional view of the contact probe according to the first embodiment of the present invention corresponding to a fabrication method after the resin mold is ground.

Following formation of a mold for electroforming, a metal layer 37 is deposited on recess portion 38 (refer to FIG. 4) of a mold 51 for electroforming as shown in FIG. 5 in the metal layer formation step. Metal layer 37 is deposited by electroforming. Electroforming refers to formation of a metal layer on a substrate using a metal solution. Then, grinding or polishing is conducted to attain a desired thickness.

Figure 7:
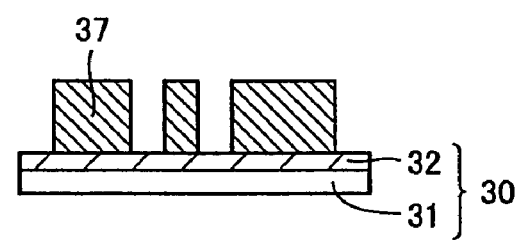
FIG. 7 is a sectional view of the contact probe according to the first embodiment of the present invention corresponding to a fabrication method after the resin mold is removed.

In the step of removing the mold for electroforming, resist film 33 on substrate 30 is removed by ashing using oxygen plasma or by development after irradiation through an X-ray or UV light. As a result, the configuration shown in FIG. 7 is obtained.

Figure 8:
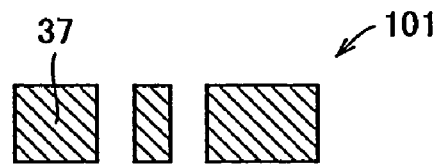
FIG. 8 is a sectional view of the contact probe according to the first embodiment of the present invention.

Then, only the portion of metal layer 37 is obtained by dissolving substrate 30 with potassium hydroxide (KOH), or by dry etching or the like. As a result, contact probe 101 as shown in FIG. 8 is obtained. This corresponds to contact probe 101 shown in FIG. 1.

By the above steps in the fabrication method, a contact probe having the plunger unit, spring unit and lead line connection unit formed integrally can be readily fabricated, accommodating the aspects of microminiaturization and complexity of a contact probe. Furthermore, the assembly task is dispensable.

EXAMPLE

To obtain the manganese concentration and carbon concentration shown in Tables 1–3 set forth afterwards, a solution having nickel sulfamic acid and manganese sulfamic acid blended was prepared, refined by activated carbon, and then added with an anti-pit inhibitor and a brightener (including butynediol).

Figure 13:
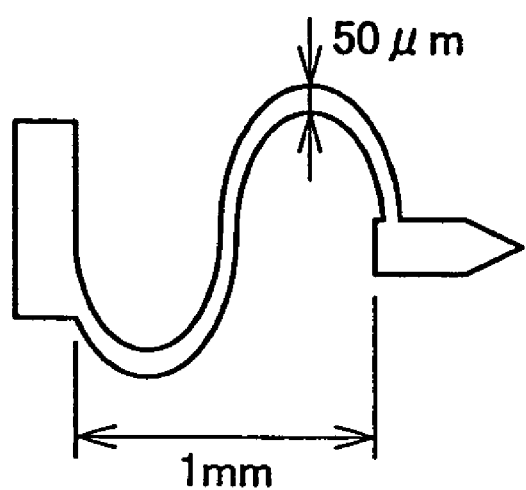
FIG. 13 is a plan view an integral mask used in the evaluation of the contact probe according to the first embodiment of the present invention.

To evaluate the characteristics as a contact probe, a probe was fabricated in accordance with the above-described contact probe fabrication method. In the fabrication of a contact probe, a mold for electroforming was formed by X-ray lithography on a resist applied on a copper plate sputtered with Ti, using a mask corresponding to a planar pattern as shown in FIG. 13. The thickness of all the probes was set to 50 μm.

Examples 1–7

Alloys were prepared all having a nickel preferred orientation of (111) and a nickel average crystal grain size of 50 nm, differing only in the containing amount of manganese, as shown in Table 1. Probes were fabricated based on these alloys.

Comparative Example 1

A probe was fabricated with the features set similar to those of Examples 1–7 with the exception that manganese is not contained.

Comparative Example 2

A probe was fabricated with the features set similar to those of Example 4 with the exception that the average crystal grain size was 100 nm.

Comparative Example 3

A probe was fabricated with the features set similar to those of Example 4 with the exception that the preferred orientation was (200).

Comparative Example 4

A probe was fabricated with the features set similar to those of Example 5 with the exception that the preferred orientation was (200).

Evaluation was conducted on the fabricated probes in accordance with respective aspects set forth below.
Evaluation Mode
1. Preferred Orientation Evaluation was conducted through XRD (X-ray Diffractometry).

Figure 14:
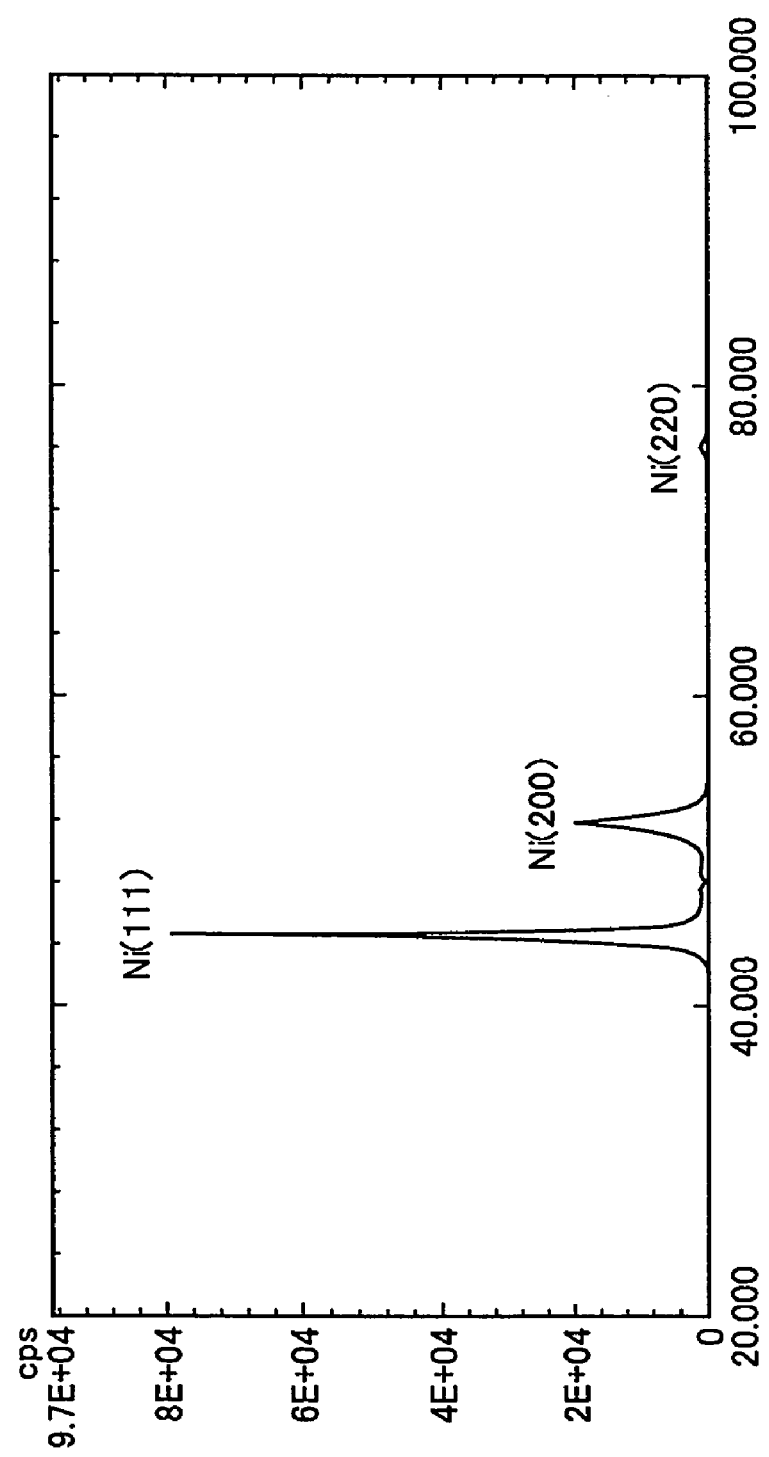
FIG. 14 is a chart representing the result of X-ray diffraction on a probe fabricated in Example 5 in the first embodiment of the present invention.

By way of example, the result of X-ray diffraction on a probe fabricated in Example 5 is shown in FIG. 14. It is appreciated from FIG. 14 that the probe had the preferred orientation of (111), the peak intensity ratio of (111) diffraction/(200) diffraction was at least 2, and the peak intensity ratio of (111) diffraction/(220) diffraction was at least 5.

2. Average Crystal Grain Size

The crystal grain size was obtained through the Willson scheme and Scherrer scheme based on the diffraction data obtained by XRD. For verification, the crystal grain size was directly confirmed from a TEM (Transmission Electron Microscopy) image.

3. Hardness

The hardness of the material was obtained by universal hardness (HU). The universal hardness was evaluated based on ISO Technical Report TR14577 or DIN50359 using a sclerometer by Fischer Instruments K. K.

4. Young's Modulus

The Young's modulus was measured using the aforementioned sclerometer. Also, the Young's modulus was obtained from a load-displacement curve by producing a specimen of H 0.05 mm×W 0.3 mm×L 1 mm and conducting a bending test. Both measurements were calculated with the Poisson's ratio as 0.3.

5. Elastic Limit

The elastic limit was obtained from the aforementioned bending test result for Young's modulus evaluation.

6. Heat Resistance

A heat resistance test was conducted by measuring the Young's modulus and elastic limit under the state where the sample was maintained at high temperature. The probe was rated as inferior when the Young's modulus or elastic limit was degraded by at least 30%. Any sample fractured during testing was also rated as inferior.

The heat resistance was evaluated based on the following criteria.

◯: Inferiority was not recognized in the measurements under 150° C. after being maintained at 150° C. for 10 days.

Δ: Inferiority was recognized in the measurements under 150° C. after being maintained at 150° C. for two days.

×: The specimen was fractured during the measurement under 100° C. after being maintained at 100° C. for ten hours.

The evaluation results of the probes are shown in Table 1. The parameters other than those in the column of heat resistance are measurements under room temperature.

improved when the preferred orientation is (111) than in the cases where the preferred orientation is (200).

Examples 8 and 9

A probe was fabricated with the features set similar to those of Example 4 with the exception that the average crystal grain size of nickel in the nickel-manganese alloy was set to 30 nm and 70 nm, respectively.

The evaluation results of the obtained probes are shown in Table 2, together with the results of Example 4 and Comparative Example 2.

TABLE 1

|  | Mn Concentration wt % | Preferred Orientation | Average Crystal Grain Size (nm) | Hardness (HU) (N/mm$^2$) | Young's Modulus (Gpa) | Elastic Limit (Mpa) | Heat Resistance |
|---|---|---|---|---|---|---|---|
| Example 1 | 0.005 | (111) | 50 | 5800 | 200 | at least 1300 | Δ |
| Example 2 | 0.01 | (111) | 50 | 5800 | 210 | at least 1300 | ○ |
| Example 3 | 0.05 | (111) | 50 | 5900 | 210 | at least 1300 | ○ |
| Example 4 | 0.1 | (111) | 50 | 5850 | 220 | at least 1300 | ○ |
| Example 5 | 0.15 | (111) | 50 | 5800 | 225 | at least 1300 | ○ |
| Example 6 | 0.3 | (111) | 50 | 5600 | 225 | 1000 | ○ |
| Example 7 | 0.4 | (111) | 50 | 5450 | 230 | 800 | ○ |
| Comparative Example 1 | 0 | (111) | 50 | 6000 | 220 | at least 1300 | X |
| Comparative Example 2 | 0.1 | (111) | 100 | 4700 | 200 | 1100 | ○ |
| Comparative Example 3 | 0.1 | (200) | 50 | 5050 | 175 | 700 | ○ |
| Comparative Example 4 | 0.15 | (200) | 50 | 4500 | 170 | 750 | ○ |

It is appreciated from the results of Examples 1–7 and Comparative Example 1 that heat resistance is improved by the inclusion of manganese. It was identified that the concentration of manganese is preferably at least 0.01% by weight from the standpoint of obtaining sufficient heat resistance. It was also found that, if the concentration of manganese is 0.3% by weight or above, the elastic limit becomes 1000 MPa or below. The elastic limit could not be maintained at a high level.

It was also appreciated from the comparison between the results of Example 4 and Comparative Example 3, or between Example 5 and Comparative Example 4 that the hardness, the Young's modulus, and the elastic limit are all

TABLE 2

|  | Mn Concentration wt % | Preferred Orientation | Average Crystal Grain Size (nm) | Hardness (HU) (N/mm$^2$) | Young's Modulus (Gpa) | Elastic limit (MPa) | Heat Resistance |
|---|---|---|---|---|---|---|---|
| Example 8 | 0.1 | (111) | 30 | 5900 | 220 | at least 1300 | ○ |
| Example 4 | 0.1 | (111) | 50 | 5800 | 220 | at least 1300 | ○ |
| Example 9 | 0.1 | (111) | 70 | 5150 | 200 | 1150 | ○ |
| Comparative Example 2 | 0.1 | (111) | 100 | 4700 | 200 | 1100 | ○ |

It is apparent from the results of Table 2 that the hardness and the elastic limit become lower as the average crystal grain size of nickel increases. It was identified that the average crystal grain size of nickel must be set to not more than 70 nm to achieve hardness greater than HU5000.

Examples 10–14

All probes were fabricated with 0.1% by weight as the manganese concentration and 50 nm as the average crystal grain size of nickel. Only the concentration of carbon in the nickel-manganese alloy was altered by adjusting the amount of butynediol that is an additive.

The evaluation results of the obtained probes are shown in Table 3.

TABLE 3

|  | Mn Concentration wt % | C Concentration wt % | Average Crystal Grain Size (nm) | Hardness (HU) (N/mm$^2$) | Young's Modulus (Gpa) | Elastic Limit (MPa) | Heat Resistance |
|---|---|---|---|---|---|---|---|
| Example 10 | 0.1 | 0 | 50 | 5800 | 220 | at least 1300 | ○ |
| Example 11 | 0.1 | 0.001 | 50 | 6000 | 210 | at least 1300 | ○ |
| Example 12 | 0.1 | 0.01 | 50 | 6300 | 230 | at least 1300 | ○ |
| Example 13 | 0.1 | 0.02 | 50 | 6600 | 225 | 1150 | ○ |
| Example 14 | 0.1 | 0.03 | 50 | 7000 | 230 | 700 | ○ |

It is appreciated from the results of Table 3 that the hardness becomes higher as the amount of carbon increases.

By using, as the material, a nickel-manganese alloy wherein the nickel average crystal grain size is not more than 70 nm and the preferred orientation of the nickel crystal is (111) in accordance with the present embodiment, a contact probe superior in the required characteristics such as elasticity, hardness and the like as well as heat resistance can be provided.

(Second Embodiment)
(Structure)

Figure 15:
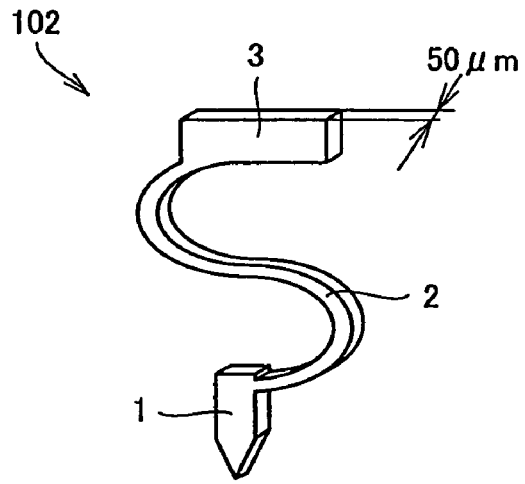
FIG. 15 is a perspective view of a contact probe according to a second embodiment of the present invention.

A contact probe 102 according to a second embodiment of the present invention is shown in FIG. 15. Contact probe 102 includes a plunger unit 1 to be brought into contact with an object to be tested, a spring unit 2 supporting plunger unit 1, and a lead line connection unit 3 fixed at the tester side, all formed integrally by a cobalt-tungsten alloy. Contact probe 102 is configured with the planar pattern shown in FIG. 13, having a predetermined thickness.

(Fabrication Method)

A fabrication method of the contact probe of the second embodiment according to the present invention will be described with reference to FIGS. 16–20.

Figure 16:
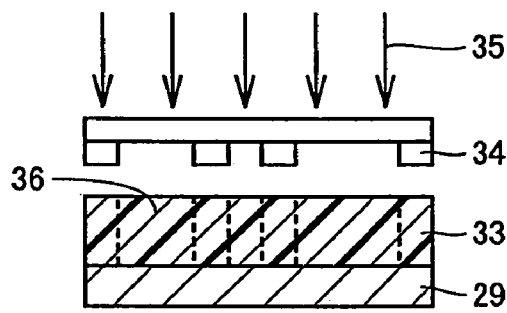
FIG. 16 shows the contact probe according to the second embodiment of the present invention to describe the first step of a fabrication method thereof.

As shown in FIG. 16, first a resist film 33 is formed on the surface of a substrate 29 having conductivity. A metal substrate such as of SUS, Cu, Al, and the like can be used for substrate 29. Also, a Si substrate, a glass substrate, and the like can be used instead of substrate 29. In this case, the metal of Ti, Al, Cu, or a combination thereof is sputtered in advance on the top surface of the Si substrate, glass substrate, and the like to form an underlying conductive layer at the surface.

Figure 17:
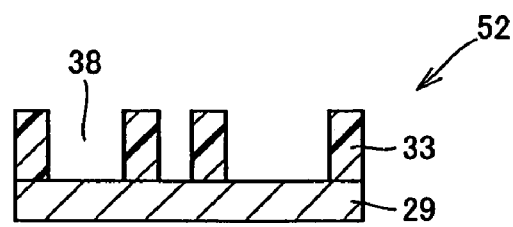
FIG. 17 shows the contact probe according to the second embodiment of the present invention to describe the second step of a fabrication method thereof.

As shown in FIG. 16, an X-ray 35 is directed onto the surface of resist film 33 through mask 34. In the present embodiment, the method of X-ray lithography is employed. Alternatively, the method of UV lithography using UV (ultraviolet ray) instead of an X-ray may be employed. In either case, the resist of exposure portion 36 is removed after development. As a result, a mold for electroforming 52 with a recess 38 is formed, as shown in FIG. 17.

Figure 18:
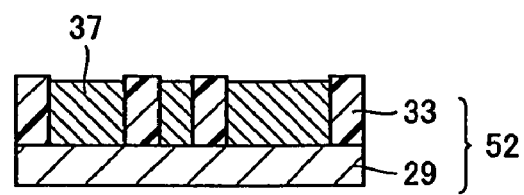
FIG. 18 shows the contact probe according to the second embodiment of the present invention to describe the third step of a fabrication method thereof.
Figure 19:
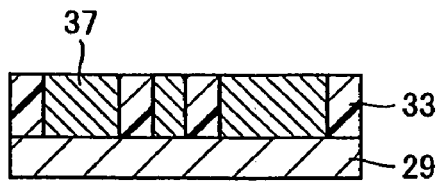
FIG. 19 shows the contact probe according to the second embodiment of the present invention to describe the fourth step of a fabrication method thereof.

As shown in FIG. 18, electroforming is conducted to fill recess 38 with a metal layer 37 of a cobalt-tungsten alloy. This electroforming step can be conducted with a metal-plating solution having cobalt sulfate, sodium tungstate, sodium gluconate, citric acid and other additives mixed appropriately. Then, the top surface is ground or polished to be arranged to the desired thickness, as shown in FIG. 19.

Figure 20:
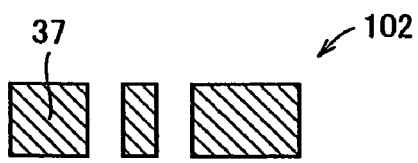
FIG. 20 shows the contact probe according to the second embodiment of the present invention to describe the fifth step of a fabrication method thereof.

Resist film 33 remaining on substrate 29 is removed by ashing or by development after re-irradiation. Substrate 29 is removed by etching or the like. As a result, a unitary contact probe 102 can be obtained by taking out metal layer 37 alone as shown in FIG. 20. Removal of substrate 29 can be effected by both wet etching and dry etching.

(Function·Advantage)

The hardness of the contact probe fabricated as described above was measured using a Micro-Vickers hardness tester. The general contact probe made from nickel or cobalt exhibits the hardness of 600 Hv at most whereas the contact probe of the present invention exhibits an appreciably high hardness of 720 Hv.

The contact probe was subjected to an abrasion test for 10000 times by being urged against an aluminum plate for scribing. The amount of abrasion at the contact with the aluminum plate was measured. The abrasion amount was 19% the abrasion amount of a nickel contact probe.

(Third Embodiment)

A contact probe is fabricated according to a fabrication method similar to that of the second embodiment, provided that, in the electroforming step of FIG. 18, recess 38 is filled with a metal layer of cobalt-molybdenum alloy instead of metal layer 37 formed of cobalt-tungsten alloy. This electroforming step can be conducted with a metal-plating solution having cobalt sulfate, sodium molybdate, citric acid and other additives mixed appropriately. A contact probe of a configuration as shown in FIG. 15 was formed with a cobalt-molybdenum alloy, likewise the second embodiment.

(Function·Advantage)

The contact probe fabricated as described above was measured using a Micro-Vickers hardness tester, and exhibited the hardness of 700 Hv.

The contact probe was subjected to an abrasion test similar to that of the second embodiment. The measured amount of abrasion was 14% the abrasion amount of a nickel contact probe.

(Fourth Embodiment)

A contact probe was fabricated in accordance with the fabrication method of the second embodiment with the electroforming condition altered. The percentage content of tungsten in the cobalt-tungsten alloy was increased. It was confirmed that a crack was generated in the contact probe when the percentage content of tungsten exceeds 25% by weight. Spring unit 2 cannot function as a spring. Therefore, it is desirable that the percentage content of tungsten is greater than 0% by weight and not more than 25% by weight.

(Fifth Embodiment)

A probe was fabricated in accordance with the fabrication method of the third embodiment with the electroforming condition altered. The amount of molybdenum in the cobalt-molybdenum alloy was increased. It was confirmed that a crack was generated in the contact probe when the content of molybdenum exceeds 18% by weight. Spring unit 2 could not function as a spring. Therefore, it is desirable that the percentage content of molybdenum is greater than 0% by weight and not more than 18% by weight.

(Sixth Embodiment)

Two nickel contact probes were fabricated in accordance with the fabrication method of the second embodiment. These contact probes exhibited the measurement of 550 Hv in hardness. One of these contact probes was coated with a 0.5 μm-thick film of cobalt-molybdenum alloy on its surface. An abrasion test similar to that of the second embodiment was conducted on the contact probe with the coat film and the contact probe without the coat film, and the amount of abrasion was measured. The amount of abrasion of the contact probe with the coat film was 35% the abrasion amount of the contact probe without the coat film. It is therefore appreciated that formation of a cobalt-molybdenum alloy film on the surface serves to increase the abrasion resistance.

A similar effect can be achieved even if the coat film is of cobalt-tungsten alloy. The metal used for the interior may be cobalt, copper, and the like in addition to nickel.

(Seventh Embodiment)

(Fabrication Method)

A fabrication method of a contact probe according to a seventh embodiment of the present invention will be described with reference to FIGS. 9–11, FIGS. 21–23, and FIG. 20.

Figure 21:
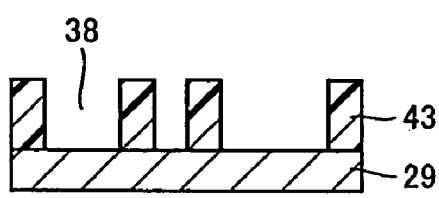
FIG. 21 shows a contact probe according to a seventh embodiment of the present invention corresponding to a first diagram to describe a fabrication method thereof.
Figure 22:
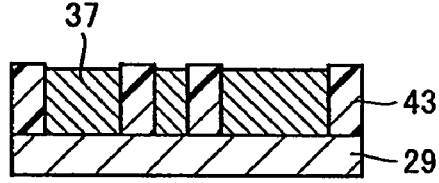
FIG. 22 shows a contact probe according to the seventh embodiment of the present invention corresponding to a second diagram to describe a fabrication method thereof.
Figure 23:
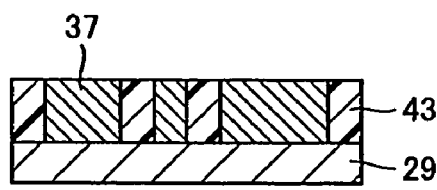
FIG. 23 shows a contact probe according to the seventh embodiment of the present invention corresponding to a third diagram to describe a fabrication method thereof.

As shown in FIG. 9, a resin mold 42 is formed by injection molding or the like using a die 41 having a convex configuration of a contact probe. As a result, resin mold 42 with a concave configuration corresponding to that of a contact probe is obtained, as shown in FIG. 10. Resin mold 42 is subjected to grinding to have the recess portion pierced. A resin pattern frame 43 as shown in FIG. 11 is obtained. A substrate 29 similar to that used in the second embodiment is prepared, and resin pattern frame 43 is attached thereon, as shown in FIG. 21. As shown in FIG. 22, electroforming is conducted to fill recess 38 with a metal layer 37 of cobalt-tungsten alloy or cobalt-molybdenum alloy. Then, the top surface is ground or polished to be arranged to a predetermined thickness, as shown in FIG. 23.

Resin pattern frame 43 remaining on substrate 29 is removed by ashing or by development after re-irradiation. Substrate 29 is removed by etching or the like. The removal of substrate 29 can be carried out through both wet etching and dry etching. As a result, contact probe 102 shown in FIG. 20 is obtained by taking out only metal layer 37.

(Function·Advantage)

Through the above-described fabrication method, a contact probe of high abrasion resistance can be obtained by employing cobalt-tungsten alloy or cobalt-molybdenum alloy as the material.

A great difference in the percentage content of tungsten or molybdenum between the plane of initiating electroforming and the plane of ending electroforming in the fabrication methods of the second and seventh embodiments will cause disproportion abrasion in the contact probe. In order to suppress this problem of disproportion abrasion to an agreeable level, the difference in the percentage content between the plane of initiating electroforming and the plane of ending electroforming is preferably within 25% of the percentage content at the plane of ending electroforming.

(Eighth Embodiment)

A contact probe is fabricated according to a fabrication method similar to that of the second embodiment, provided that, in the electroforming step of FIG. 18, recess 38 is filled with a metal layer of nickel-molybdenum alloy instead of metal layer 37 formed of cobalt-tungsten alloy. This electroforming step can be conducted with a metal-plating solution having nickel sulfate, sodium molybdate, sodium gluconate, citric acid and other additives mixed appropriately. As a result, a contact probe of a configuration as shown in FIG. 15 was formed with a nickel-molybdenum alloy.

(Function·Advantage)

The contact probe fabricated as described above was measured using a Micro-Vickers hardness tester, and exhibited the hardness of 700 Hv. The general contact probe made from nickel or cobalt exhibits the hardness of 600 Hv whereas the contact probe of the present embodiment exhibits a higher hardness.

The contact probe was subjected to an abrasion test similar to that of the second embodiment, and the abrasion amount was measured. The abrasion amount was 20% the abrasion amount of a nickel contact probe.

A contact probe was fabricated in accordance with the above fabrication method with the electroforming condition altered. The percentage content of molybdenum in the nickel-molybdenum alloy was increased. It was confirmed that a crack was generated in the contact probe when the content of molybdenum exceeds 25% by weight, and spring unit 2 cannot function as a spring. Therefore, it is desirable that the percentage content of molybdenum is greater than 0% by weight and not more than 25% by weight.

(Ninth Embodiment)

A contact probe is fabricated according to a fabrication method similar to that of the seventh embodiment, provided that, in the electroforming step of FIG. 22, recess 38 is filled with a metal layer of nickel-molybdenum alloy instead of metal layer 37 formed of cobalt-tungsten alloy or cobalt-nickel-molybdenum alloy. As a result, a contact probe of a configuration as shown in FIG. 15 was formed with a nickel-molybdenum alloy. A contact probe fabricated as described above offers advantages similar to those of the eighth embodiment.

(Tenth Embodiment)

Likewise the sixth embodiment, a contact probe is coated with a 0.5 μm-thick film of nickel-molybdenum alloy on its surface. An abrasion test similar to that of the second embodiment was conducted on the contact probe with the coat film and the contact probe without the coat film, and the amount of abrasion was measured. The amount of abrasion of the contact probe with the coat film was 38% the abrasion amount of the contact probe without the coat film. It is therefore appreciated that formation of a nickel-molybdenum alloy coat film on the surface serves to increase the abrasion resistance.

The metal used for the interior may be cobalt, copper, and the like in addition to nickel.

(Eleventh Embodiment)

A contact probe of nickel-molybdenum alloy containing 20% by weight molybdenum was fabricated in accordance with the fabrication method of the eighth embodiment. The electrical resistance of this contact probe was measured. The electrical resistance of this contact probe was 3.5Ω, which is approximately 7 times that of a nickel contact probe. This contact probe made from nickel-molybdenum alloy was subjected to a heat treatment of 300° C., whereby the metal crystal of the nickel-molybdenum alloy was partially rendered into ordered alloy. It is found that the electrical resistance is lowered to 0.6Ω, which is substantially equal to that of a nickel contact probe. Also, the hardness which was 720 Hv in Vickers hardness prior to the heat treatment is increased to 780 Hv. The present embodiment is extremely preferable in that the hardness of the contact probe is maintained at least 600 Hv while the electrical resistance is suppressed to a level equal to that of a nickel contact probe.

A great difference in the percentage content of molybdenum between the plane of initiating electroforming and the plane of ending electroforming in the fabrication methods of the eighth and ninth embodiments will cause disproportion abrasion in the contact probe. In order to suppress this problem of disproportion abrasion to an agreeable level, the difference in the percentage content between the plane of initiating electroforming and the plane of ending electroforming is preferably within 25% the percentage content at the plane of ending electroforming.

INDUSTRIAL APPLICABILITY

The present invention is applicable to a contact probe for use to electrically test a semiconductor IC chip, a liquid crystal display, and the like.

The invention claimed is:

1. A contact probe including a probe body consisting integrally of a metal and having a three-dimensional configuration with a uniform thickness at an entire region of said configuration on a reference plane, as results from filling a cavity in a mold with said metal through electroforming to form said probe body of said contact probe, wherein said metal comprises a nickel-manganese alloy having nickel grains with an average crystal grain size not more than 70 nm and a preferred nickel crystal orientation, as determined by X-ray diffraction, of (111) toward a deposition direction of the electroforming corresponding to a direction of said uniform thickness.

2. The contact probe according to claim 1, wherein said metal consists of said nickel-manganese alloy.

3. The contact probe according to claim 2, wherein said average crystal grain size is not more than 50 nm.

4. The contact probe according to claim 2, wherein said nickel-manganese alloy contains at least 0.01% by weight and less than 0.3% by weight of manganese.

5. The contact probe according to claim 2, wherein said nickel-manganese alloy contains carbon.

6. The contact probe according to claim 5, wherein said nickel-manganese alloy contains not more than 0.02% by weight of carbon.

7. An arrangement comprising:

a flat planar electrically conductive substrate;

a resin mold layer with an opening that defines a mold cavity in said resin mold layer disposed on a surface of said electrically conductive substrate; and a probe body for a contact probe, wherein said probe body consists of a layer of a nickel-manganese based alloy deposited by electroforming in said mold cavity on said surface of said electrically conductive substrate, so that said nickel-manganese alloy fills a plan shape of said mold cavity in said resin mold layer, said probe body integrally includes a spring portion that is elastically compressible in a direction between opposite first and second ends thereof, a contact tip portion at said first end of said spring portion, and an electrical connection portion at said second end of said spring portion, as a single integral piece configured as said probe body for a contact probe, and said nickel-manganese based alloy has nickel grains with an average nickel crystal grain size of not more than 70 nm and a preferred nickel crystal orientation of (111), as determined by X-ray diffraction, in a direction through a thickness of said layer of said nickel-manganese based alloy from said surface of said electrically conductive substrate.

8. The arrangement according to claim 7, wherein said average crystal grain size is not more than 50 nm.

9. The arrangement according to claim 7, wherein said nickel-manganese based alloy contains manganese in an amount of at least 0.01% by weight and less than 0.3% by weight.

10. The arrangement according to claim 7, wherein said nickel-manganese based alloy contains nickel, manganese and carbon.

11. The arrangement according to claim 7, wherein said nickel-manganese based alloy contains nickel and manganese and not more than 0.02% by weight of carbon.

* * * * *